United States Patent
Chen et al.

(10) Patent No.: US 6,479,398 B1
(45) Date of Patent: Nov. 12, 2002

(54) METHOD OF MANUFACTURING AN AMORPHOUS-SILICON THIN FILM TRANSISTOR

(75) Inventors: Jr-Hong Chen; Jeng-Hung Sun, both of Hsinchu; Hsixg-Ju Sung, Keelung; Pi-Fu Chen, Taipei; Dou-I Chen, Nantou, all of (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/692,247

(22) Filed: Oct. 18, 2000

(30) Foreign Application Priority Data

Aug. 2, 2000 (TW) ........................................ 89115509 A

(51) Int. Cl.[7] ....................... H01L 21/302; H01L 21/461
(52) U.S. Cl. ........................ 438/734; 438/708; 438/709; 438/711; 438/713; 438/714; 438/669; 438/673
(58) Field of Search ................................ 438/708, 709, 438/711, 713, 714, 734, 669, 673

(56) References Cited

U.S. PATENT DOCUMENTS

| | | | | |
|---|---|---|---|---|
| 4,684,436 A | * | 8/1987 | Burns et al. | 156/643 |
| 5,545,576 A | | 8/1996 | Matsumoto et al. | |
| 5,719,078 A | | 2/1998 | Kim | |
| 6,075,256 A | * | 6/2000 | Kaifu et al. | 257/53 |
| 6,200,906 B1 | * | 3/2001 | Batra et al. | 438/708 |

OTHER PUBLICATIONS

Four Photolithography Process Amorphous–Silicon Thin––Film Transistor Array, Author: Pi–Fu Chen et al. May 16–18, 2000, SID 00 Digest, pp1011–1013.

* cited by examiner

*Primary Examiner*—Carl Whitehead, Jr.
*Assistant Examiner*—Khanh Duong

(57) ABSTRACT

A structure of an amorphous-silicon thin film transistor array comprises a substrate, a gate electrode, a gate insulating layer, an amorphous-silicon active layer, an n+ amorphous-silicon layer and a metal layer. The metal layer defines a source electrode and a drain electrode. The structure simplifies the photolithography process by using a less number of masks to manufacture thin film transistors. It also reduces the occurrence of open circuits in the first metal (MI) layer or short circuits between the MI layer and the second metal (MII) layer caused by the photoresist residue or particle contamination. The manufacturing method combines a conventional back-channel-etched (BCE) reduced mask process and a two-step exposure technology. The two-step exposure technology uses two photoresist pattern masks. One is a pattern mask for complete exposure with higher light intensity and the other is a pattern mask for incomplete exposure with lower light intensity. The photoresist pattern with incomplete exposure is then etched by an $O_2$ plasma etching process. The amorphous-silicon layer and the metal layer has the characteristic of an island metal masking structure that protects the active layer from plasma damage in plasma etching process.

11 Claims, 16 Drawing Sheets

Pattern A

Pattern B

| RF mode | RIE mode | PE mode |
|---|---|---|
| $O_2$ (sccm) | 400 | 400 |
| Power (W) | 800 | 500 |
| Cooler temperature | 20 | 40 |
| Pressure (Torr) x $10^{-3}$ | 100 | 375 |

FIG. 5

METHOD OF MANUFACTURING AN AMORPHOUS-SILICON THIN FILM TRANSISTOR

FIELD OF THE INVENTION

The present invention relates generally to a structure of a thin film transistor (TFT), and more specifically to a structure of an amorphous-silicon (a-Si) thin film transistor array and its manufacturing method. The manufacturing method uses a two-step exposure (TSE) technology to reduce the number of photolithography process steps.

BACKGROUND OF THE INVENTION

Generally, in a thin film transistor liquid crystal display (LCD) using an amorphous-silicon, a black resistance responsive to an OFF-state of the TFT is high, thereby increasing its switching efficiency. In addition, the TFT is formed at a low temperature and is applicable to a large-sized glass substrate, so that it is now being produced on a commercial scale as the main device. U.S. Pat. No. 5,545,576 discloses a manufacturing process of such a TFT panel. The TFT panel can reduce the number of steps in the manufacturing process and the occupation ratio of the TFT.

The method for manufacturing a TFT panel disclosed in U.S. Pat. No. 5,545,576 comprises (a) forming a gate electrode and a gate line on a transparent insulating substrate; (b) successively forming a gate insulating film, a semiconductor thin film and an insulating film on the gate electrode, the gate line and the transparent insulating substrate; (c) patterning the insulating film into a shape which is self-aligned with the gate electrode and the gate line by means of exposure through the transparent insulating substrate; (d) forming, on the insulating film, a mask having a length which extends across the gate electrode at right angles; (e) etching at least the insulating film and the semiconductor thin film using the mask; and (f) removing the mask, thereby forming a source electrode and a drain electrode.

At present, mass production of an amorphous-silicon thin film transistor usually takes six or seven (even more) photolithography process steps. Photolithography process, which is complicated and requires high precision, includes sequential process steps such as patterning a photo mask, coating photoresist, exposing, and developing. Therefore, reducing the number of masks needed in the manufacturing process can reduce the cost of production and particle contamination. The process flow of the conventional six-mask photolithography process for manufacturing amorphous-silicon thin film transistor comprises forming a gate electrode on a first metal (MI) layer, forming an active layer patterned as an island, making contact holes connecting the MI layer and a second metal layer, forming an indium-tin-oxide (ITO) layer, forming a source electrode and a drain electrode on a second metal (MII) layer, and forming a passivation layer.

In advanced amorphous-silicon thin film transistor manufacturing technologies, photolithography process is reduced to five-mask process flow. One of the manufacturing technologies is that the five masks are used sequentially in (a) an MI layer, (b) an active layer, (c) an MII layer, (d) a passivation layer, and (e) an ITO layer. The other is that the five masks are used sequentially in (a) an MI layer, (b) an active layer, (c) an MII layer, (d) contact holes and a passivation layer, and (e) an ITO layer.

U.S. Pat. No. 5,719,078 discloses a method for making a completely self-aligned thin film transistor panel of a liquid crystal display. The manufacturing method includes the steps of forming a gate electrode on a transparent substrate; depositing sequentially a gate insulating layer, a semiconductor layer and a first insulating layer; forming a channel protecting layer aligned with the gate electrode by patterning the first insulating layer; implanting ions into the semiconductor layer; depositing a conductive layer; patterning the conductive layer together with the semiconductor layer; forming a passivation layer including both a first opening and a second opening; forming a pixel electrode connected to the conductive layer through the second opening; and etching the conductive layer by using both the pixel electrode and the second insulating layer as a mask to form a source electrode and a drain electrode.

Five masks are needed for making a TFT disclosed in the above U.S. Pat. No. 5,719,078. The five masks are used sequentially in (a) a gate electrode, (b) a channel protecting layer, (c) a conductive layer and a semiconductor layer, (d) a passivation layer, and (e) a pixel electrode. The conductive layer and the semiconductor layer are patterned using a single mask in a single process step, thereby reducing the cost of production.

SUMMARY OF THE INVENTION

The primary object of the present invention is to provide a structure of an amorphous-silicon thin film transistor array for reducing the photolithography process steps as well as the number of photo-masks needed in manufacturing the thin film transistor array. Another object of the present invention is to provide a structure of an amorphous-silicon thin film transistor array for achieving better contact condition between MII and island layers. It is also an object of the present invention to provide a structure of an amorphous-silicon thin film transistor array for reducing the occurrence of open circuits in the MI layer or short circuits between MI and MII layers caused by the photoresist residue or particle contamination.

According to the invention, the structure of an amorphous-silicon thin film transistor array comprises (a) a substrate; (b) a gate electrode formed on the substrate; (c) a gate insulating layer formed on the gate electrode; (d) an amorphous-silicon active layer formed on the gate insulating layer; (e) an n+ amorphous-silicon layer formed on the active layer; and (f) a metal layer formed on the n+ amorphous-silicon layer for defining a source electrode and a drain electrode. The n+ amorphous-silicon layer and the metal layer have the characteristic of an island metal masking structure that can protect the active layer from plasma damage in plasma etching process.

In addition, this invention provides a method for making the amorphous-silicon thin film transistor array. The manufacturing method combines a conventional back-channel-etched (BCE) reduced mask process and a two-step exposure technology. The two-step exposure technology combines the island layer with the MII layer in a single process step, thereby reducing the process flow of the photolithography process.

According to the invention, the manufacturing method of an amorphous-silicon thin film transistor array comprises the following steps: (a) sputtering an MI layer and patterning thereon as a gate electrode on a substrate using a photo-mask by a photolithography process step; (b) sequentially depositing a gate insulating layer, an intrinsic amorphous-silicon layer and an n+ amorphous-silicon layer on the gate electrode and the entire substrate, and sputtering an MII layer on the entire substrate; (c) using the two-step exposure technology to combine an island layer with the MII layer in a single photolithography process step and forming a source electrode and a drain electrode on the MII layer; (d) forming a passivation layer on the entire substrate; and (e) forming an indium-tin-oxide layer on the passivation layer.

The two-step exposure technology of the invention in step (b) uses two photoresist pattern masks. One is pattern A mask for complete exposure. The other is pattern B mask for incomplete exposure. In the two-step exposure process, the photoresist is coated and exposed using pattern A mask with higher light intensity for complete exposure, and then exposed using pattern B mask with lower light intensity for incomplete exposure. Then the photoresist on pattern B is etched with $O_2$ plasma etching. Steps (d) and (e) are completed by a conventional 5-mask Top ITO process method.

According to the invention, the advance process of the MII layer in step (b) can reduce the occurrence of open circuits in the MI layer or short circuits between the MI layer and the MII layer caused by the photoresist residue or particle contamination.

In the preferred embodiments of the invention, the general issues in two-step exposure process are the photoresist thickness and the thickness uniformity of the pattern B. The photoresist thickness is in the range of 1 μm to 10 μm. The light intensity for complete exposure is in the range of 30 mj/cm$^2$ to 250 mj/cm2. The light intensity for incomplete exposure is in the range of 30 mj/cm$^2$ to 150 mj/cm$^2$. The thickness of the remaining photoresist in the channel region is in the range of 500 Å (Angstrom) to 50,000 Å. Two modes of $O_2$ plasma etching process used are plasma enhanced (PE) mode and reactive ion etching (RIE) mode.

The foregoing and other objects, features, aspects and advantages of the present invention will become better understood from a careful reading of a detailed description provided herein below with appropriate reference to the accompanying drawings.

BRIEF DESCRIPTION OF THE DRAWINGS

FIG. 5 shows the etching recipes of two different etchers used in PE mode and RIE mode $O_2$ plasma etching process in the manufacturing process of an amorphous-silicon thin film transistor array according to the invention.

DETAILED DESCRIPTION OF THE PREFERRED EMBODIMENTS

Figure 1:
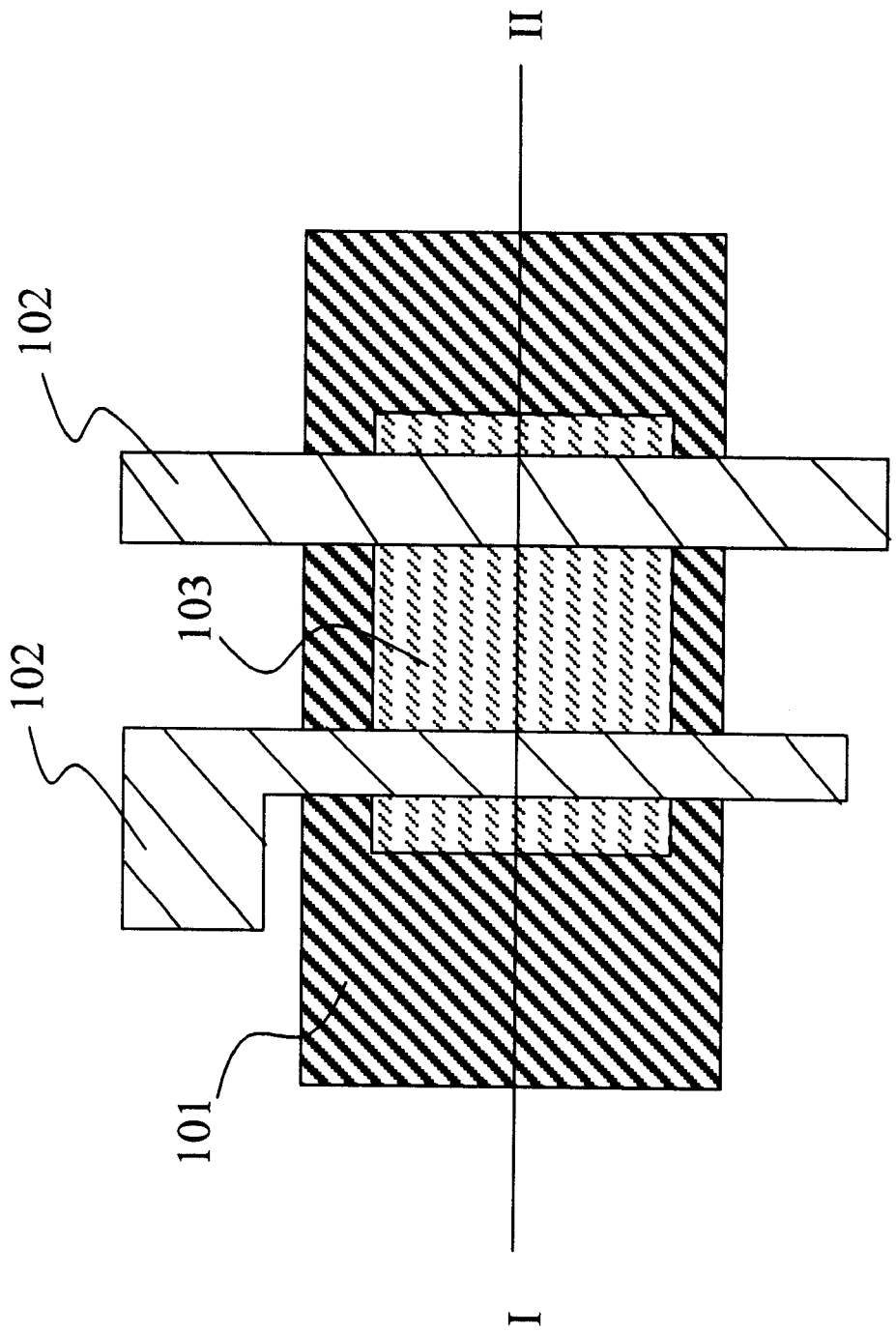
FIG. 1 shows the schematic diagram of a top view of a pixel in an amorphous-silicon thin film transistor array according to the invention.

FIG. 1 shows the schematic diagram of a top view of a pixel in an amorphous-silicon thin film transistor array according to the invention. As shown in FIG. 1, the pixel in an amorphous-silicon thin film transistor array comprises an MI layer 101, an MII layer 102 and an amorphous-silicon layer 103. A gate electrode is patterned on the MI layer 101. A source electrode and a drain electrode on the MII layer 102 are formed by depositing a gate insulating layer and the amorphous-silicon layer 103 and sputtering the MII layer 102.

Figure 2:
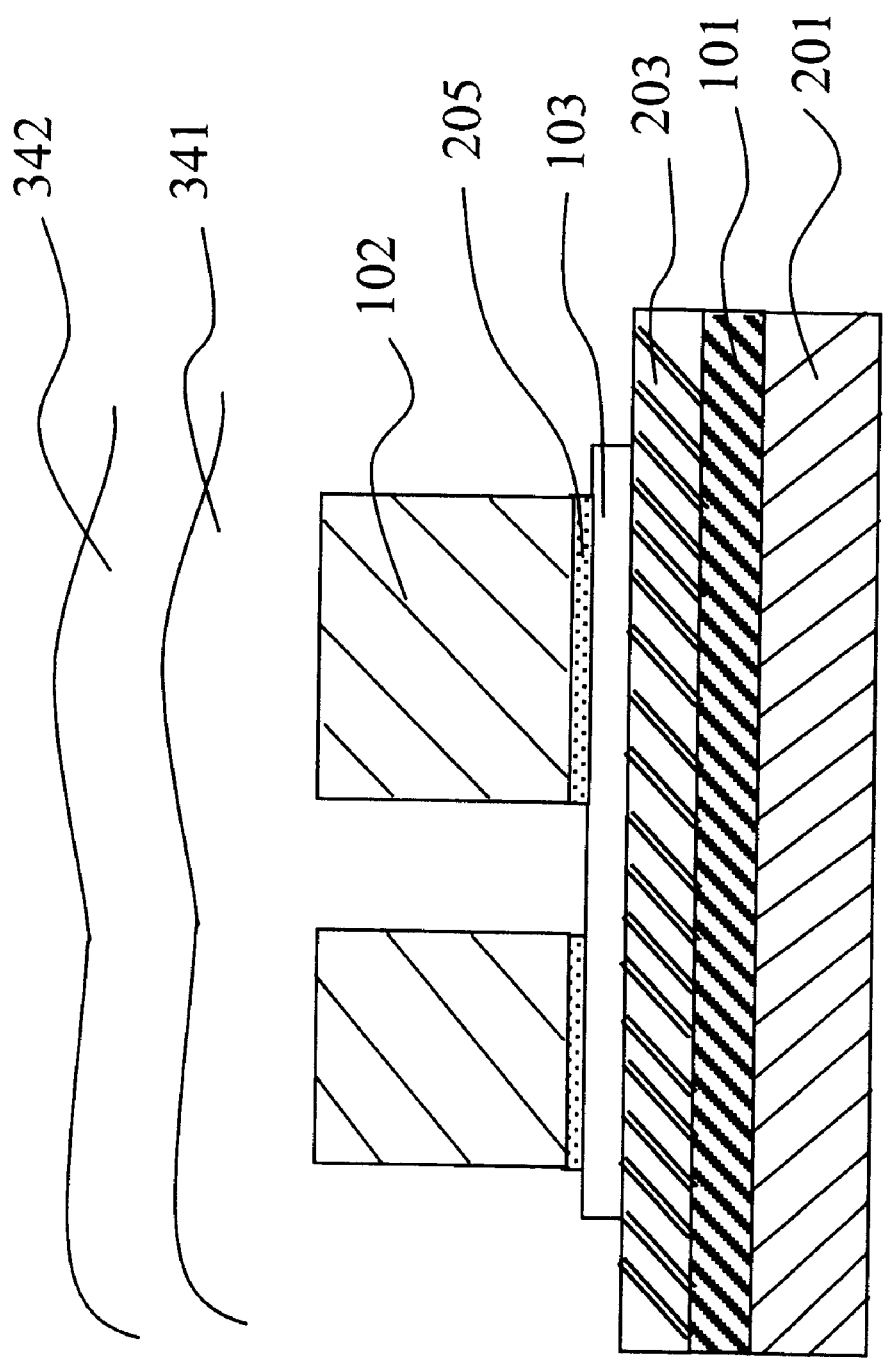
FIG. 2 shows a cross section along line AA' of FIG. 1.

FIG. 2 shows a cross section along line I–II of FIG. 1. As shown in FIG. 2, the structure of an amorphous-silicon thin film transistor array comprises a substrate 201, a gate electrode 101 formed on the substrate 201, a gate insulating layer 203 formed on the gate electrode 101, an amorphous-silicon active layer 103 formed on the gate insulating layer 203, an n+ amorphous-silicon layer 205 formed on the active layer 103 and a metal layer 102 formed on the n+ amorphous-silicon layer 205. The metal layer 102 defines a source electrode and a drain electrode. The n+ amorphous-silicon layer 205 and the metal layer 102 have the characteristic of an island metal masking structure that can protect the active layer from plasma damage in plasma etching process.

According to the invention, the material such as glass for the substrate is transparent and non-conductive. The material for the MI layer can be chosen from one of the group of wolfram (W) and molybdous (Mo) compounds, aluminum (Al), aluminum-alloy, titanium (Ti), chromium (Cr), molybdenum and a multi-layer comprising the above-mentioned materials.

The material for the MII layer can be chosen from one of the group of multi-layer metal having Cr/Al, Cr/Al/Cr, Mo/Al, Mo/Al/Mo, Ti/Al, or Ti/Al/Ti, where, for example, Cr/Al means a layer of chromium followed by a layer of aluminum. The active layer is an amorphous-silicon layer.

Figure 3:
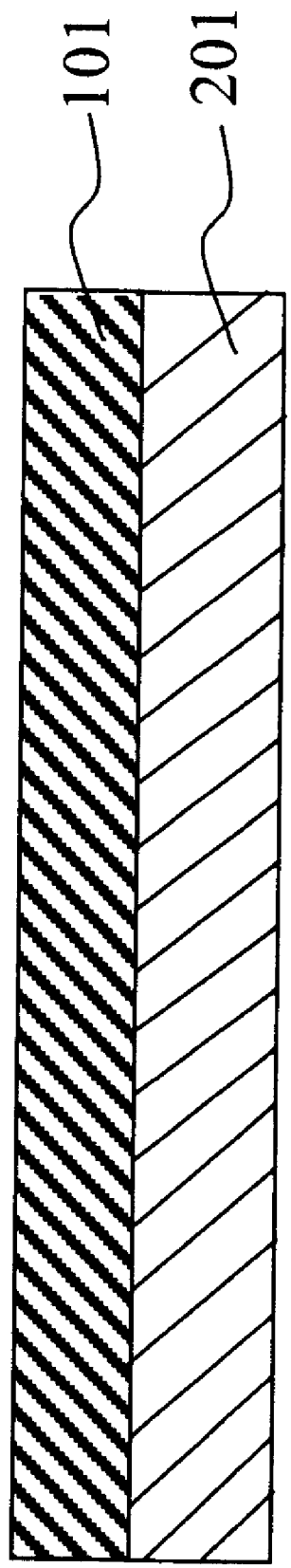
FIGS. 3(a)–3(e) show the manufacturing process of a pixel in an amorphous-silicon thin film transistor array shown in FIG. 2 according to the invention.

FIGS. 3(a)–3(e) show the manufacturing process of a pixel in an amorphous-silicon thin film transistor array shown in FIG. 2 according to the invention. Referring to FIG. 3(a), an MI layer 101 is sputtered on a substrate 201. A photoresist pattern (using a first mask) is coated on the MI layer 101 to form a gate electrode 101 by a photolithography process. In the embodiment, the material for the MI layer 101 is a MoW compound of thickness 500 Å to 15000 Å.

Figure 3B:
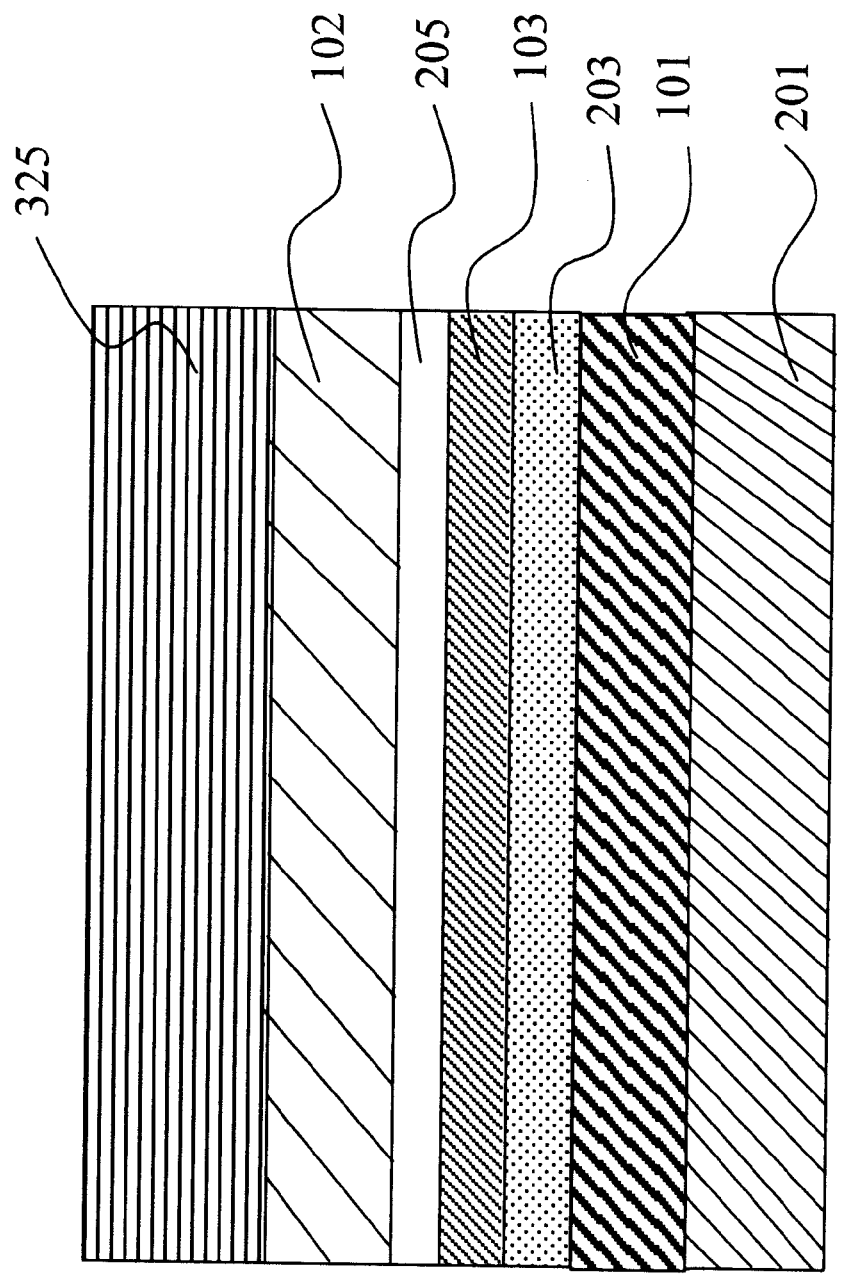
Figure 3:
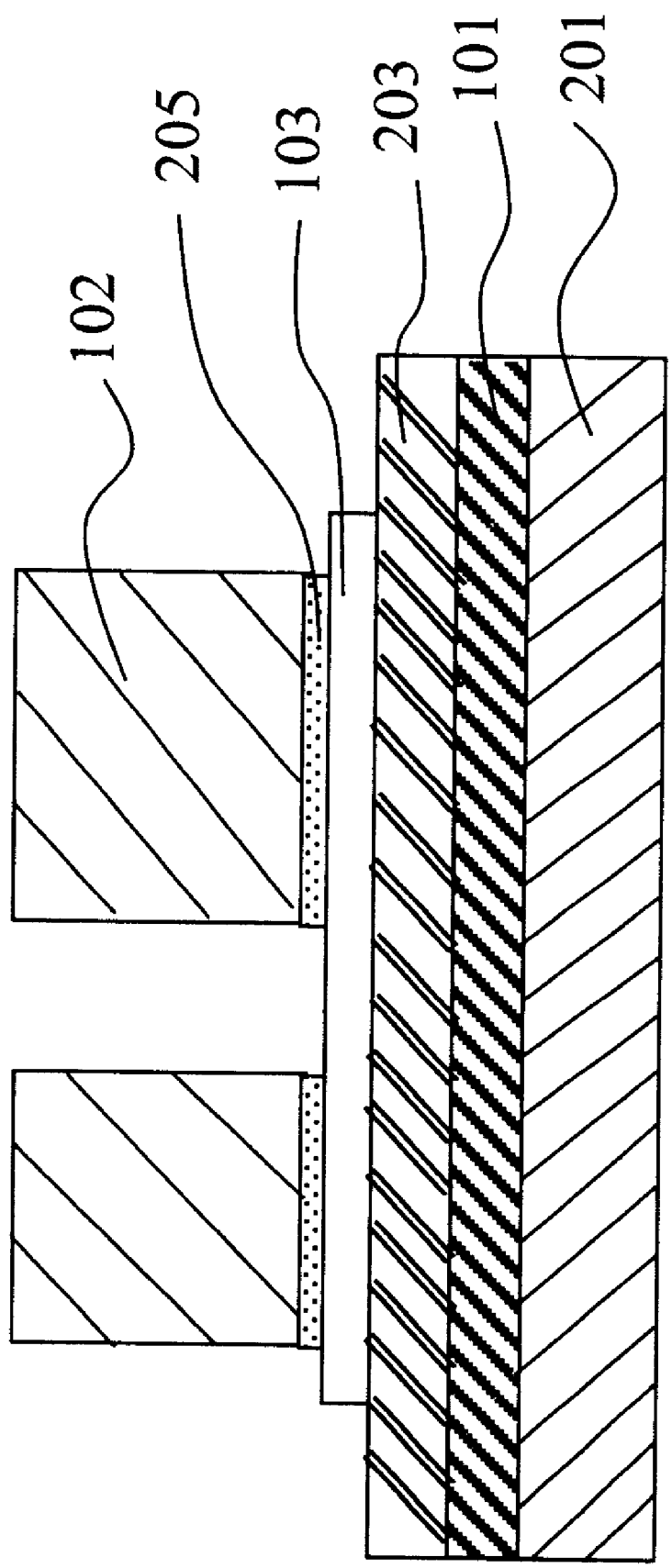

Referring to FIG. 3(b), the manufacturing process is accomplished by depositing sequentially a gate insulating layer 203, an intrinsic amorphous-silicon layer 103 and an n+ amorphous-silicon layer 205 on the MI layer 101 and the whole substrate 201, and then sputtering an MII layer 102 thereon. Finally, a layer of photoresist 325 is coated on the entire surface. In the embodiment, the material for the gate insulating layer 203 is SiNx of thickness 1500 Å to 5000 Å. The thickness of the intrinsic amorphous-silicon layer 103 may range from 500 Å to 2000 Å and the thickness of the n+ amorphous-silicon layer 205 is 300 Å. The materials used in the MII layer 102 are Cr of 500 Å, Al of 6000 Å and Cr of 1000 Å.

Figure 3D:
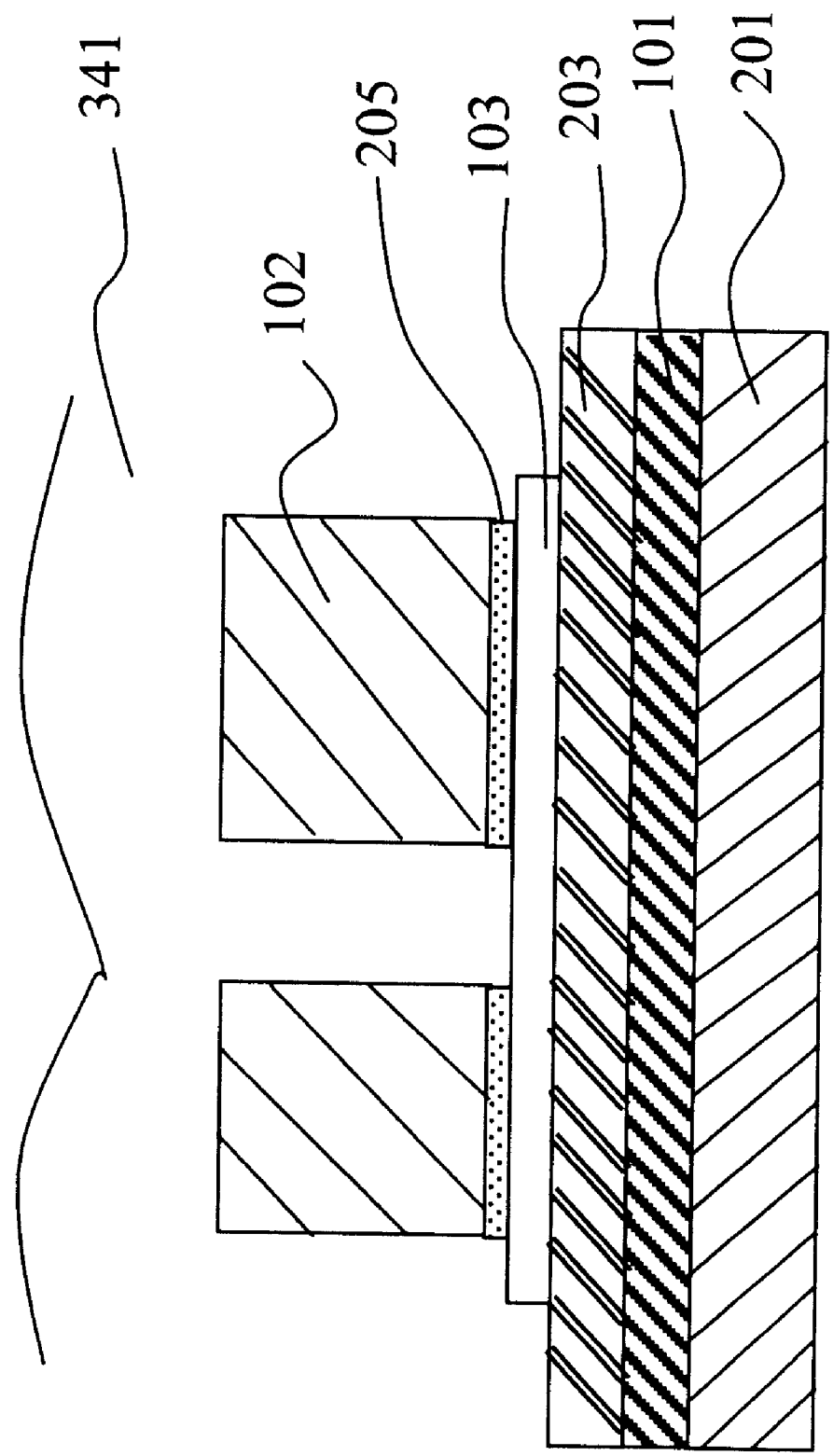
Figure 3E:
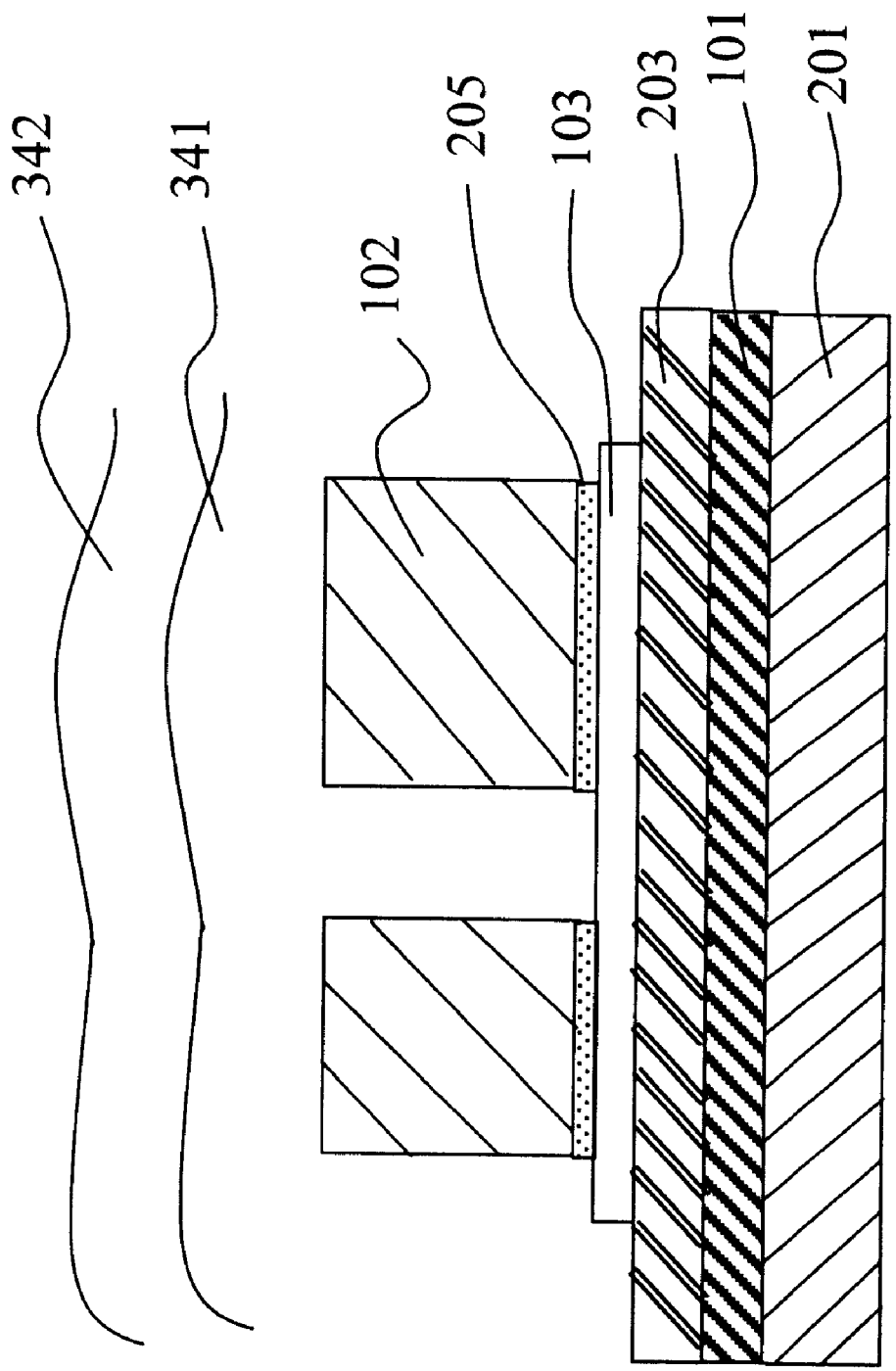

In the following step, a two-step exposure technology is used to combine the patterning of the island layer which includes the intrinsic amorphous-silicon layer 103 and the n+ amorphous-silicon layer 205 and the MII layer in a single photolithography process step (using a second mask). The result is shown in FIG. 3(c). Then a passivation layer 341 (using a third mask) and an indium-tin-oxide layer 342 (using fourth mask) are formed. This can be accomplished by a method used in the conventional 5-mask Top ITO process. These two steps are shown in FIG. 3(d) and FIG. 3(e) respectively.

The following describes the detailed process flow of the two-step exposure technology shown in FIGS. 3(b) to 3(c).

Figure 4A:
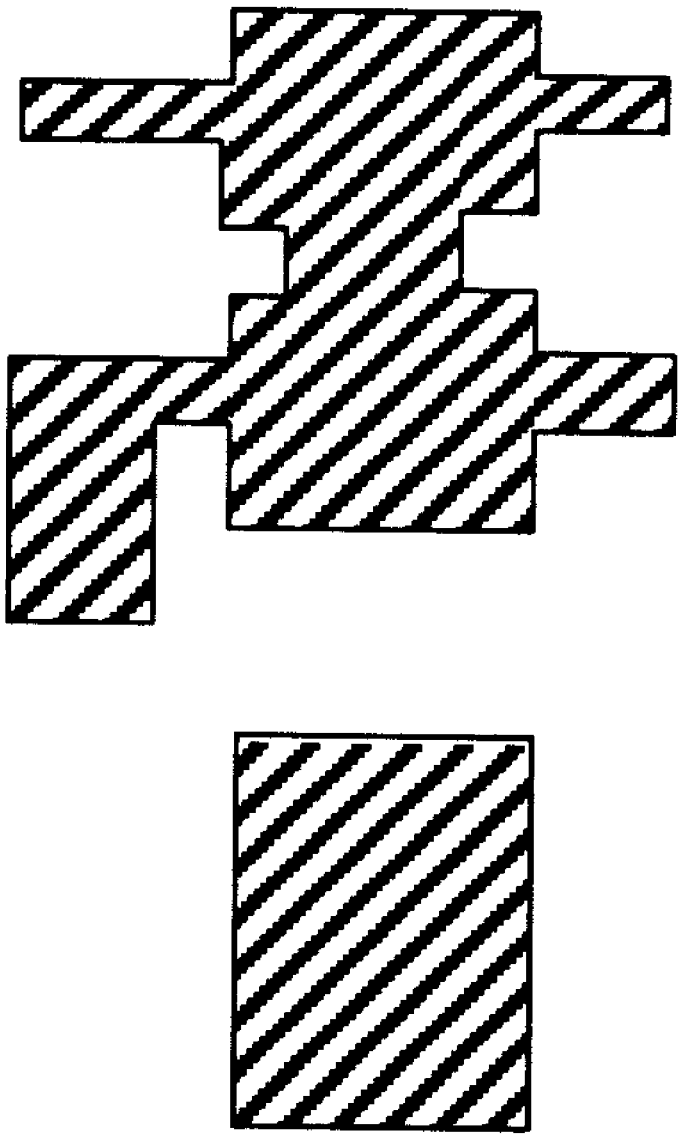
FIGS. 4(a)–4(b) show pattern A for complete exposure and pattern B for incomplete exposure respectively in the two-step exposure process of the invention.
Figure 4B:
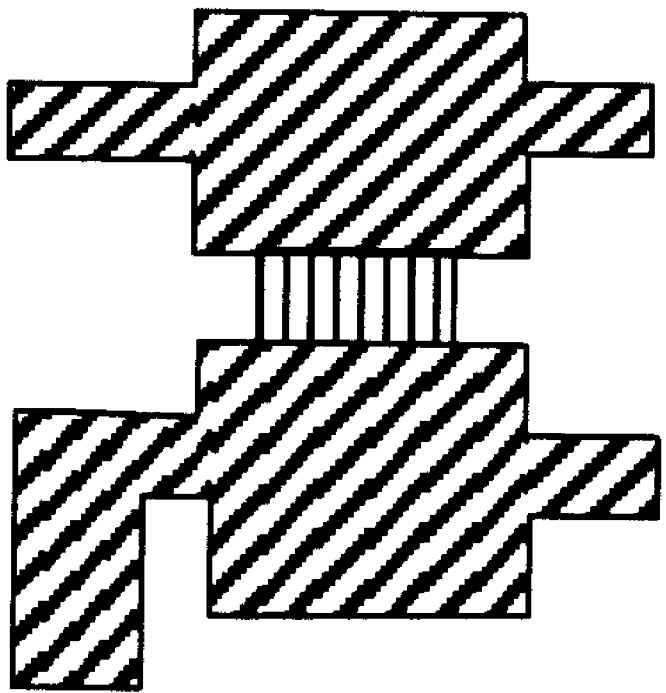
Figure 4B:
Figure 4B:
Figure 4C:
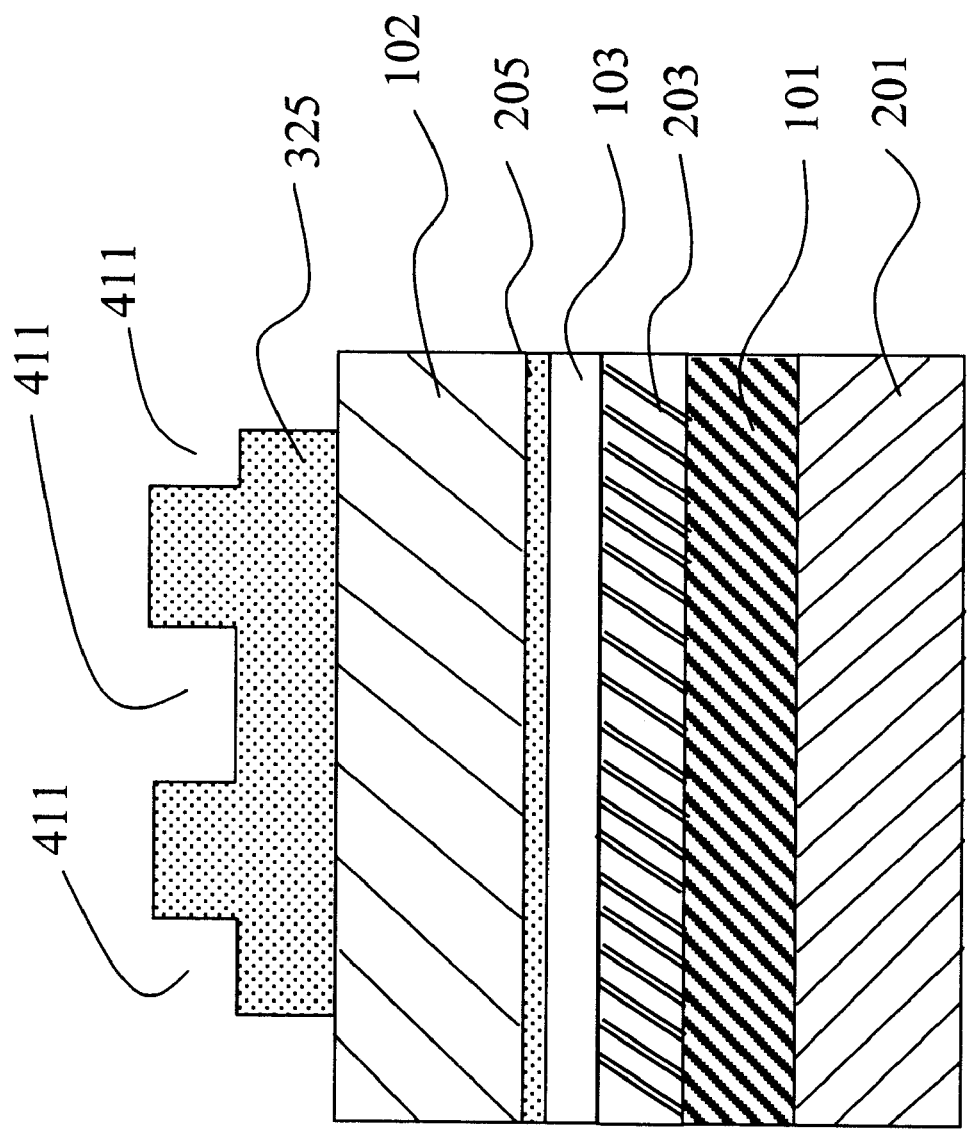
FIGS. 4(c)–4(g) show the detail process flow of the two-step exposure according to the invention.

Following the step shown in FIG. 3(b), a layer of photoresist is coated on the entire surface. Pattern A, as shown in FIG. 4(a), is used as a mask and the entire surface is exposed with higher light intensity for complete exposure. Then pattern B, as shown in FIG. 4(b), is used as a mask and the entire surface is exposed with lower light intensity for incomplete exposure. After development, the result is shown in FIG. 4(c). Referring to FIG. 4(c), the channel region remains a thinner layer of photoresist 325.

Figure 4D:
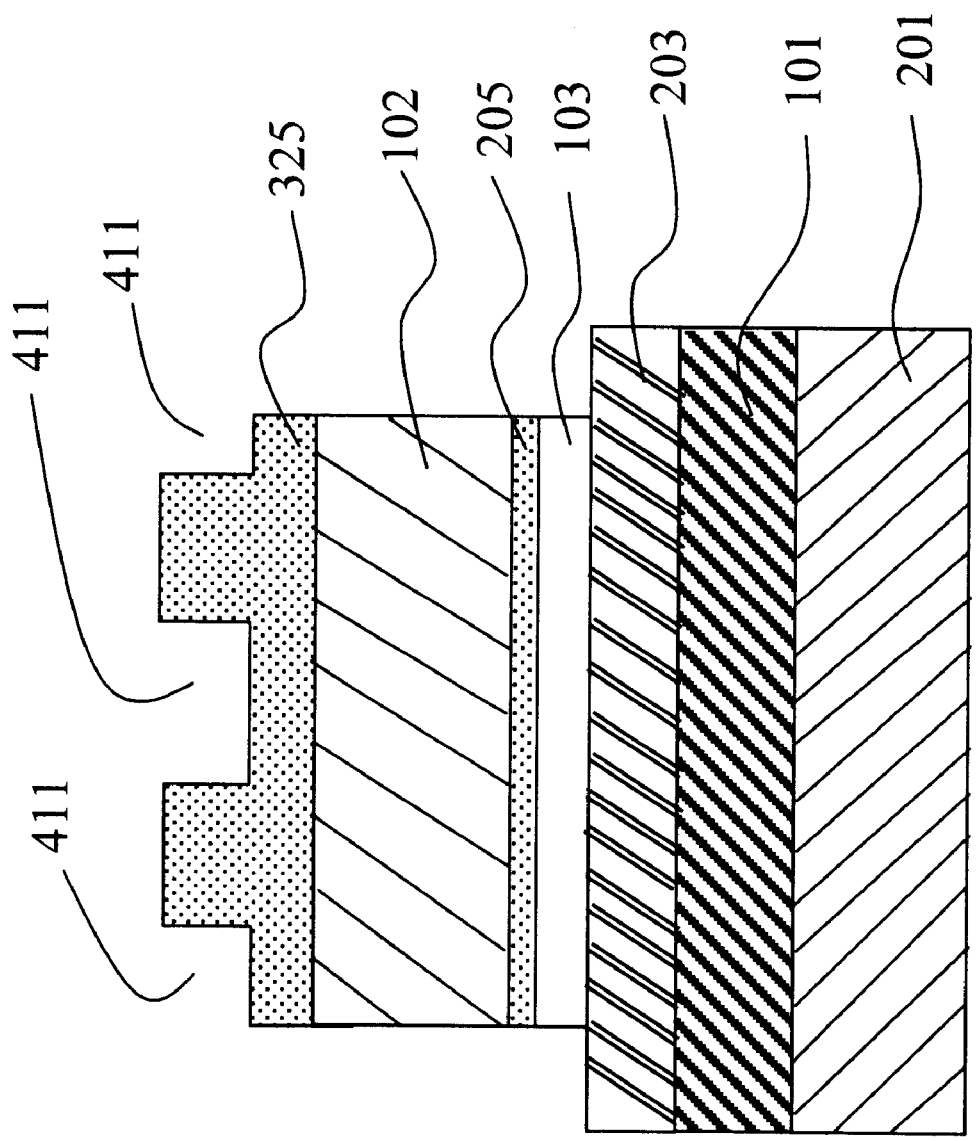
Figure 4E:
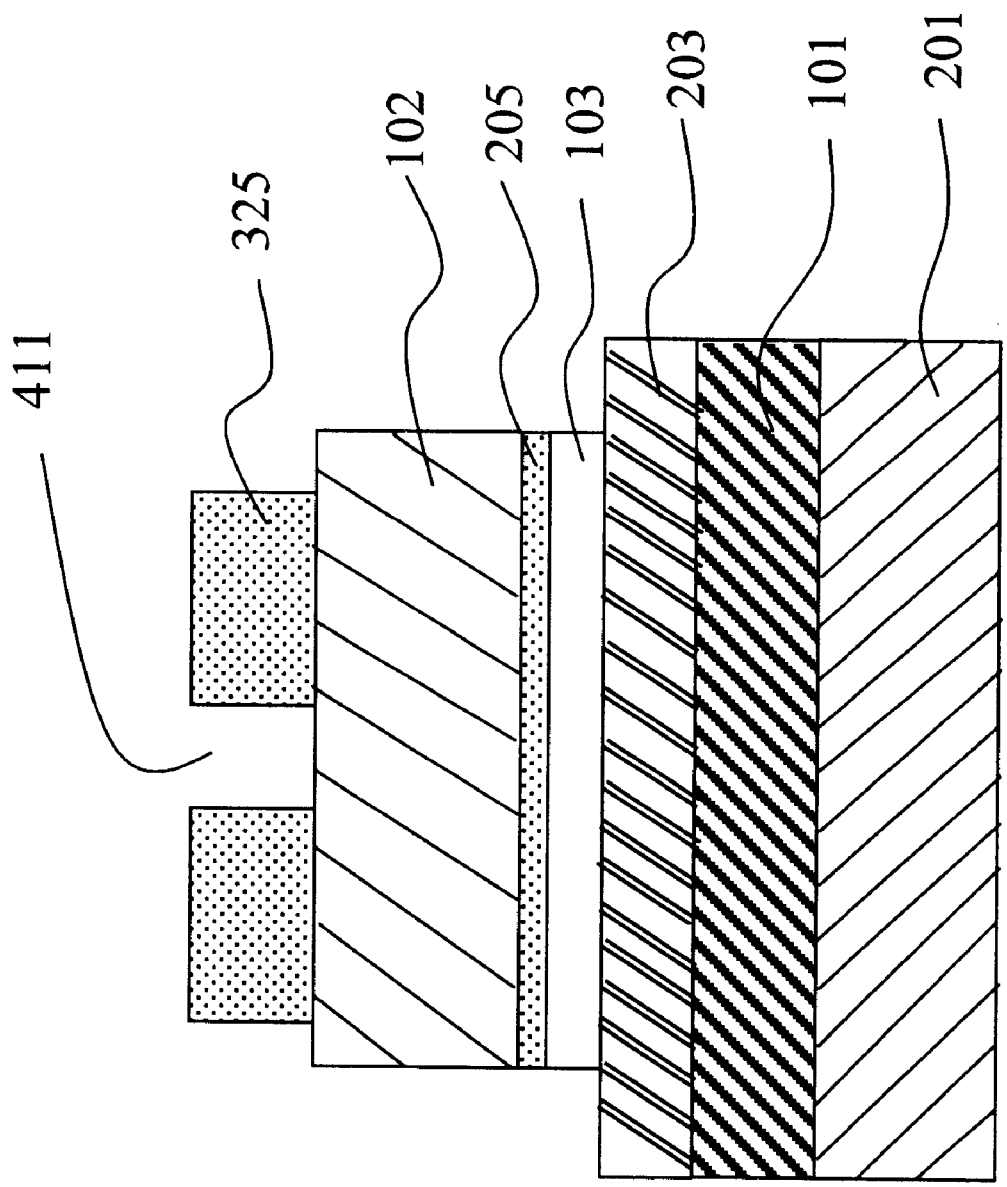
Figure 4F:
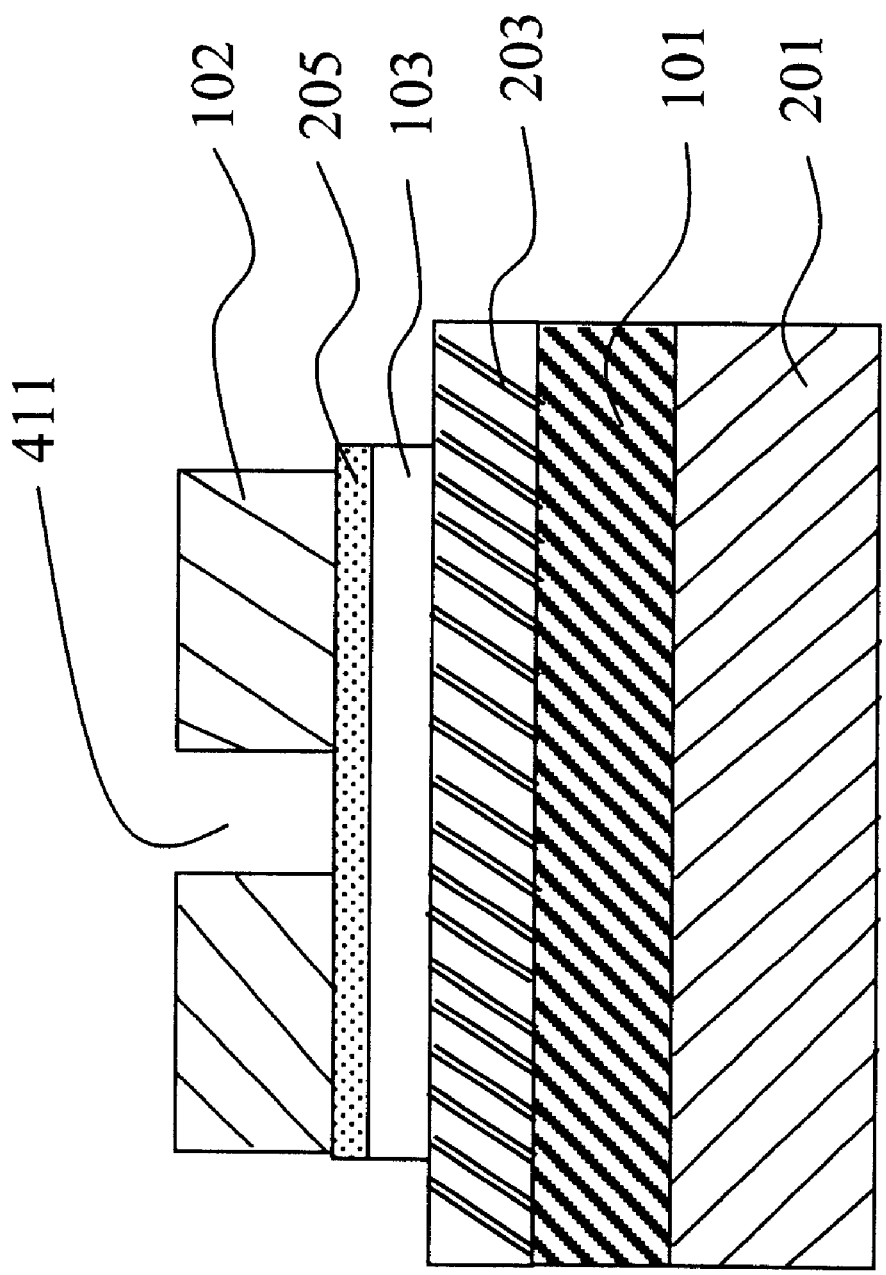
Figure 4G:
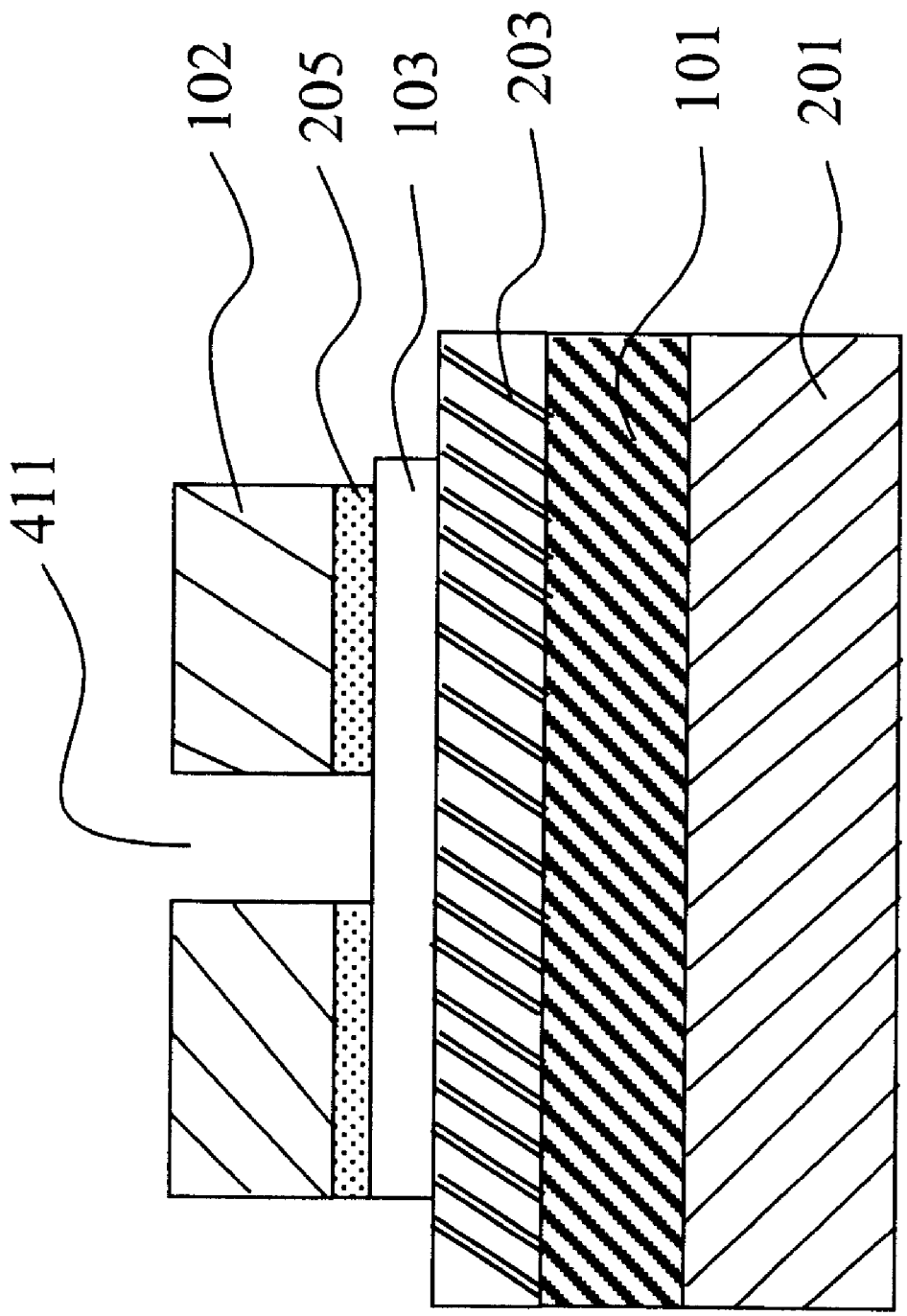

The MII layer 102 is wet-etched. Then, the amorphous-silicon layer 103 and the n+ amorphous-silicon layer 205 are dry-etched. The result is shown in FIG. 4(d). An $O_2$ plasma etching process is performed to remove the residual photoresist on the channel region 411. The result is shown in FIG. 4(e). The MII layer 102 is wet-etched again and the photoresist thereon is removed completely. The result is shown in FIG. 4(f). Finally, the n+ amorphous-silicon layer 205 is dry-etched again using MII layer 102 as a mask and the result is shown in FIG. 4(g).

In the above-mentioned two-step exposure process, the thickness and the thickness uniformity of the photoresist on pattern B are two important issues. Those are not easy to control because the incompletely exposed photoresist usually creates a large deviation on thickness. In addition, if the thickness difference of the photoresist between pattern A and pattern B is less than 3000 Å, there will be a very narrow process window in the $O_2$ plasma etching process and the n+ amorphous-silicon etching process. Furthermore, photoresist patterns with incomplete exposure usually produce very dull edge. If the edge is too smooth, the photoresist at sidewalls will be connected on the top and bottom area of the channel region. This will cause some residues in following channel MII etching process and failure in n+ amorphous-silicon etching process.

In the preferred embodiments of the invention, the photoresist is etched about 50 Å to 25000 Å in the island etching process after the first MII layer wet etching process and $O_2$ plasma etching rate is about 10 Å to 1500 Å. Because of these two etching factors, the photoresist thickness on the channel region cannot be too thin. In other words, increasing the photoresist thickness may widen the process window. This invention uses positive photoresist material. After many trials under various exposure conditions, this invention found that better photoresist thickness is about 1 μm to 10 μm, better intensity for complete exposure is about 30 mj/cm² to 250 mj/cm², better intensity for incomplete exposure is about 30 mj/cm² to 150 mj/cm² and the remaining photoresist thickness on the channel region is about 500 Å to 50000 Å. This range of the remaining photoresist thickness on the channel region is very safe for the following n+ amorphous-silicon and amorphous-silicon dry etching process and $O_2$ plasma etching process.

Two modes of $O_2$ plasma etching process, PE mode and RIE mode, are used according to the invention. FIG. 5 shows the etching recipes of two different etchers used in the PE mode and the RIE mode $O_2$ plasma etching process. Referring to FIG. 5, the etchers used in the RIE mode are 400 sccm $O_2$, 800 W power, 20° C. cooler temperature and 100 mTorr pressure. The etchers used in the PE mode are 400 sccm $O_2$, 500 W power, 40° C. cooler temperature and 375 mTorr pressure. When the RIE mode $O_2$ plasma etching process is used to remove the photoresist on the channel region, the following MII wet etching process failed. The MII on the channel region can not be removed by the wet etching process even with a long period of over-etching which only produces serious lateral etching, and leads to source-drain MII breakdown. By using the PE mode $O_2$ plasma etching process to remove photoresist on the channel region, no process issue of this kind is encountered. The cause of this process issue may be due to the formation of CrOx on the surface of the top MII layer in the RIE mode $O_2$ plasma etching process which is not unexpected. In the PE mode, chemical reaction dominates the etching process, and less energy (momentum) is transferred to the film. Therefore, it is harder to overcome the activation energy to form CrOx.

$Cl_2$ plasma treatment before MII wet etching process is one solution to solve the issue of forming oxide on the MII layer. It is effective but the uniformity is not easy to control. In addition, changing the MII material or etching the channel MII with dry etching process may be another solution to this issue.

Figure 6:
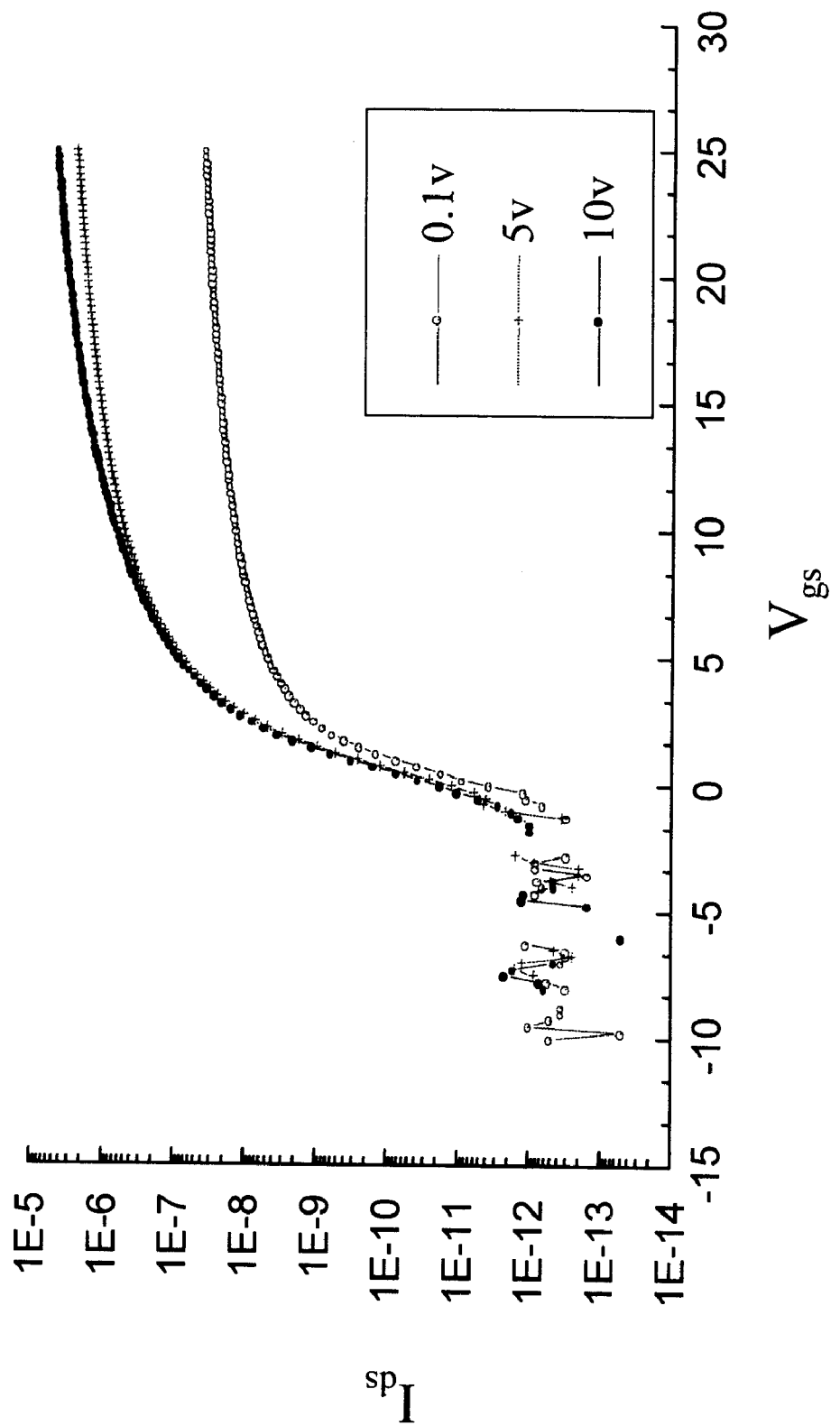
FIG. 6 shows the characteristic of the drain-source current $I_{ds}$ vs. the gate-source voltage $V_{gs}$ at a room temperature according to the invention.

FIG. 6 shows the characteristic of the drain-source current $I_{ds}$ vs. the gate-source voltage $V_{gs}$ at room temperature according to the invention. Referring to FIG. 6, the horizontal axis represents the gate-source voltage $V_{gs}$ and the vertical axis represents the drain-source current $I_{ds}$. The threshold voltage $V_{th}$ is about 2.63 volts. The field effect mobility $\mu_{FE}$ is about 0.74 cm²/v-sec. The sub-threshold swing is about 0.72 v/dec. The result shows that the TFT characteristic is not affected noticeably by the series etching process.

Although this invention has been described with a certain degree of particularity, it is to be understood that the present disclosure has been made by way of preferred embodiments only and that numerous changes in the detailed construction and combination as well as arrangement of parts may be restored to without departing from the spirit and scope of the invention as hereinafter set forth.

What is claimed is:

1. A method of manufacturing an amorphous-silicon thin film transistor comprising the steps of:
   (a) preparing a substrate;
   (b) sputtering a first metal layer on said substrate;
   (c) forming a gate electrode by patterning said first metal layer using a photo-mask by a photolithography process;
   (d) sequentially depositing a gate insulating layer, an intrinsic amorphous-silicon layer and an n+ amorphous-silicon layer on said gate electrode and said substrate;
   (e) sputtering a second metal layer on said n+ amorphous-silicon layer;
   (f) processing an island structure including said second metal layer using a two-step exposure technology in a single photolithography process to form a source electrode and a drain electrode on said second metal layer, said two-step exposure technology including a step of exposing a first region on a photoresist layer coated on said second metal layer with complete exposure using a first pattern mask, and a step of exposing a second region on said photoresist layer with incomplete exposure using a second pattern mask;
   (g) forming a passivation layer on said source electrode, said drain electrode, and other exposed surface above said substrate; and
   (h) forming an indium-tin-oxide layer on said passivation layer.

2. A method of manufacturing an amorphous-silicon thin film transistor comprising the steps of:
   (a) preparing a substrate;
   (b) sputtering a first metal layer on said substrate;

(c) forming a gate electrode by patterning said first metal layer using a photo-mask by a photolithography process;

(d) sequentially depositing a gate insulating layer, an intrinsic amorphous-silicon layer and an n+ amorphous-silicon layer on said gate electrode and said substrate;

(e) sputtering a second metal layer on said n+ amorphous-silicon layer;

(f) processing an island structure including said second metal layer using a two-step exposure technology in a single photolithography process to form a source electrode and a drain electrode on said second metal layer;

(g) forming a passivation layer on said source electrode, said drain electrode, and other exposed surface above said substrate; and (h) forming an indium-tin-oxide layer on said passivation layer;

wherein said two-step exposure technology in step (f) further comprises the following steps:

(f1) coating a photoresist layer on said second metal layer;

(f2) exposing a first region on said photoresist layer with complete exposure using a first pattern mask;

(f3) exposing a second region on said photoresist layer with incomplete exposure using a second pattern mask;

(f4) developing said photoresist layer;

(f5) wet-etching said second metal layer;

(f6) dry-etching said amorphous-silicon layer and said n+ amorphous-silicon layer;

(f7) performing an $O_2$ plasma etching process to remove residual photoresist layer in a channel region exposed with incomplete exposure;

(f8) wet-etching said second metal layer again;

(f9) removing remaining photoresist layer on said second metal layer; and (f10) dry-etching said n+ amorphous-silicon layer using said second metal layer as a mask.

3. The method of manufacturing an amorphous-silicon thin film transistor as claimed in claim 2, wherein higher light intensity is used in step (f2) for complete exposure and lower light intensity is used in step (f3) for incomplete exposure.

4. The method of manufacturing an amorphous-silicon thin film transistor as claimed in claim 3, said higher light intensity being in the range of 30 mj/cm$^2$ to 250 mj/cm$^2$ and said lower light intensity being in the range of 30 mj/cm$^2$ to 150 mj/cm$^2$.

5. The method of manufacturing an amorphous-silicon thin film transistor as claimed in claim 2, said $O_2$ plasma etching process being an $O_2$ plasma etching process with plasma enhanced mode.

6. The method of manufacturing an amorphous-silicon thin film transistor as claimed in claim 2, said $O_2$ plasma etching process being an $O_2$ plasma etching process with reactive ion etching mode.

7. The manufacturing method of an amorphous-silicon thin film transistor as claimed in claim 2, the thickness of said photoresist layer in said channel region being in the range of 500 Å to 50,000 Å.

8. The method of manufacturing an amorphous-silicon thin film transistor as claimed in claim 2, said photoresist being etched about 50 Å to 25,000 Å and said $O_2$ plasma etching rate being about 10 Å to 1,500 Å in said step (f7).

9. The method of manufacturing an amorphous-silicon thin film transistor as claimed in claim 2, wherein the thickness difference of said photoresist layer in said first region and said second region after development being less than 3,000 Å.

10. The method of manufacturing an amorphous-silicon thin film transistor as claimed in claim 1, wherein the thickness of said gate insulating layer is in the range of 1,500 Å to 5,000 Å.

11. The method of manufacturing an amorphous-silicon thin film transistor as claimed in claim 1, the thickness of said first metal layer being in the range of 500 Å to 15,000 Å.

* * * * *